United States Patent
Kikuchi et al.

[11] Patent Number: 5,807,657
[45] Date of Patent: Sep. 15, 1998

[54] POLYVINYL ALCOHOL BASE PHOTOSENSITIVE RESIN, PHOTOSENSITIVE COMPOSITION, AND METHOD FOR PATTERN-FORMATION USING THE SAME

[75] Inventors: Hideo Kikuchi; Noriaki Tochizawa; Yasuo Kuniyoshi, all of Inba-gune, Japan

[73] Assignee: Toyo Gosei Kogyo Co., Ltd., Chiba, Japan

[21] Appl. No.: 763,415

[22] Filed: Dec. 11, 1996

[51] Int. Cl.⁶ .............................. G03F 7/08; G03F 7/038; G03F 7/30

[52] U.S. Cl. ...................... 430/287.1; 430/325; 430/197; 525/59; 525/61

[58] Field of Search ................................. 430/287.1, 325, 430/197; 522/59, 61

[56] References Cited

U.S. PATENT DOCUMENTS

| | | | |
|---|---|---|---|
| 4,339,524 | 7/1982 | Ichimura et al. | 430/270.1 |
| 4,777,114 | 10/1988 | Ichimura et al. | 430/287.1 |

FOREIGN PATENT DOCUMENTS

| | | |
|---|---|---|
| 46-218 | 6/1971 | Japan . |
| 50-41534 | 4/1975 | Japan . |
| 56-11906 | 2/1981 | Japan . |
| 56-5761 | 6/1981 | Japan . |
| 56-5762 | 6/1981 | Japan . |
| 2-118575 | 2/1990 | Japan . |
| 2-160807 | 6/1990 | Japan . |
| 2-276806 | 11/1990 | Japan . |
| 4-82140 | 3/1992 | Japan . |
| 59-17550 | 1/1994 | Japan . |
| 6-43645 | 2/1994 | Japan . |

OTHER PUBLICATIONS

Shibuya et al, CA 126: 150526, American Chemical Society, Columbus, Ohio, English Abstract of Japanese Patent Document, Kokai, 08–320553, Printed Dec. 3, 1996.

*Primary Examiner*—Cynthia Hamilton
*Attorney, Agent, or Firm*—Huntley & Associates

[57] ABSTRACT

A polyvinyl alcohol base photosensitive resin comprised of a polyvinyl alcohol base polymer compound with the structural units of formulae (I) and (II)

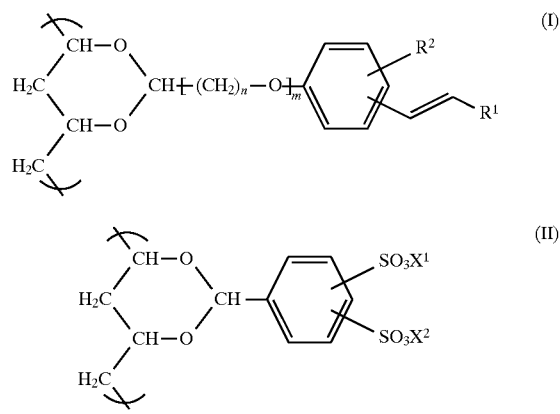

as well as a photosensitive resin composition comprising this resin and, optionally, an anionic additive and a method of forming a pattern using this photosensitive composition. $R^1$ is a residue of a heterocyclic ring with quaternarized aromatic species, $R^2$ is hydrogen atom or lower alkoxyl group, M is 0 or 1, and n is 1 to 6. $X^1$, $X^2$ are hydrogen atom, sodium, potassium or ammonium ion. These resins aid in water solubility, compatibility and sensitivity and are used in forming screen printing plates, black matrix or phosphor pattern formation of color cathode ray tubes, color filters, color printing proofs and etching resists.

8 Claims, No Drawings

POLYVINYL ALCOHOL BASE PHOTOSENSITIVE RESIN, PHOTOSENSITIVE COMPOSITION, AND METHOD FOR PATTERN-FORMATION USING THE SAME

BACKGROUND OF THE INVENTION

The present invention relates to a polyvinyl alcohol base photosensitive resin, a photosensitive resin composition, and a method of forming a pattern using the resin or the composition. The present invention allows a favorable pattern formation on an anionic substrate as a consequence of its excellent mutual solubility with an anionic additive.

As water-soluble polyvinyl alcohol base photosensitive resins, heretofore, polyvinyl alcohol base photosensitive resins described in patent documents such as Japanese Patent Application Publication No. 56-5761, Japanese Patent Application Publication No. 56-5762, Japanese Patent Application Laying-open No. 56-11906, Japanese Patent Application Laying-open No. 59-17550, Japanese Patent Application Laying-open 2-118575, Japanese Patent Application Laying-open No. 2-276806, and Japanese Patent Application Publication No. 6-43645 have been known. Each of these comprises a styryl derivative as a pendant group having a nitrogen heterocyclic ring with a quaternary aromatic species. However, these resins have the following disadvantages. That is, these photosensitive resins show high photo-sensitivities but poor water-resistance. Therefore they can be swelled at the stage of development, resulting in an insufficient resolution. In addition, these photosensitive resins are cationic materials, so that each of them tends to become thicker or to become a gel when they are mixed with an anionic additive such as an anionic surfactant and an emulsion. Furthermore, when a pattern is formed on an anionic surface of the substrate using the above photosensitive resin, scum can be generated as a result of ionic interaction.

In a previous attempt to solve the above disadvantages, a polyvinyl alcohol having a styryl derivative as a pendant group having a nitrogen heterocyclic ring with a quaternary aromatic species having betaine structure as a polyvinyl alcohol base photosensitive resin is disclosed in Japanese Patent Application Laying-open No. 2-160807. In this case, however, the photosensitive resin has several disadvantages including an insufficient water-solubility and a slightly lowered sensitivity.

Accordingly, all of the conventional polyvinyl alcohol base photosensitive resins described above have several disadvantages including poor water-resisting properties, poor thermal-resisting properties, and poor compatible properties with anionic additives.

SUMMARY OF THE INVENTION

The present invention provides a photosensitive resin having the excellent properties of water-resistance and thermal-resistance, sufficient water-solubility, and sufficient compatibility with an anionic additive, together with a photosensitive resin composition and a method of pattern formation using the novel resin or composition.

Specifically, the present invention provides a polyvinyl alcohol base photosensitive resin characterized by comprising a polyvinyl alcohol base polymer compound having structural units of the following general formula (I) and (II):

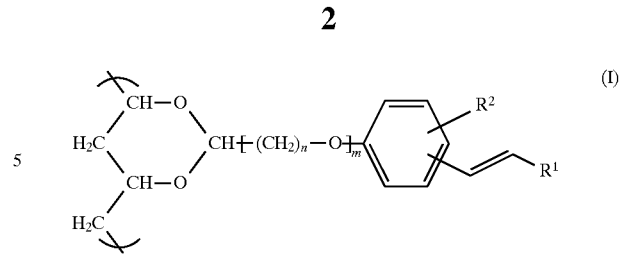

wherein $R^1$ denotes a residue of a heterocyclic ring having a quaternarized aromatic species, $R^2$ denotes a hydrogen atom or a lower alkoxyl group, m is 0 or 1, and n is an integer number selected from 1 to 6; and

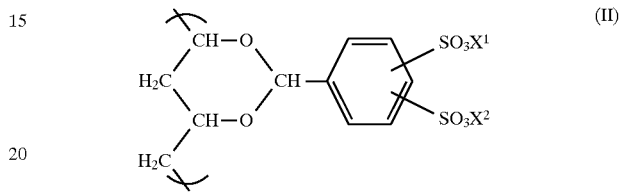

wherein each of $X^1$ and X2 independently denotes a hydrogen atom, a sodium ion, a potassium ion, or an ammonium ion, wherein the content of the structural unit of the general formula (I) is about from 0.5 to 10 mole %, while the content of the structural unit of the general formula (II) is about from 0.1 to 20 mole %.

Preferably, the mole ratio represented by the structural unit of the general formula (I)/the structural unit of the general formula (II) may be less than about 2.

The present invention further provides a polyvinyl alcohol base photosensitive resin composition comprising the above polyvinyl base photosensitive resin.

Preferably, the mole ratio represented by the structural unit of the general formula (I)/the structural unit of the general formula (II) in the above polyvinyl alcohol base photosensitive resin may be less than about 2.

Preferably, the photosensitive resin composition of the present invention further comprises anionic additive.

The present invention still further provides a method of forming a pattern, comprising the steps of: forming a photosensitive resin layer on a substrate by applying the above polyvinyl alcohol base photosensitive resin composition of the present invention; to a substrate performing a pattern exposure on said photosensitive resin layer; and subsequently developing the resulting exposed layer.

DETAILED DESCRIPTION OF THE INVENTION

The present invention is based on the discovery that a polyvinyl alcohol base polymer compound obtained by suspending a styryl compound having a nitrogen heterocyclic ring with a quaternary aromatic species and a phenyl compound having two sulfone groups at a predetermined mole ratio satisfies the previous deficiencies noted above. Specifically, the polyvinyl alcohol base photosensitive resins of the present invention exhibit good water-resistance and high-sensitivity. In addition, especially those resins in which the mole ratio represented by the structural unit of the general formula (I)/the structural unit of the general formula (II) is less than about 2 show good compatibility with an anionic additive, and hence can be used for forming a pattern on an anionic substrate.

The polyvinyl alcohol base polymer compound used in the photosensitive resin of the present invention can be easily prepared by reacting saponified poly (vinyl acetate) or saponified copolymer of vinyl acetate with the other vinyl compound with an aldehyde or an acetal represented by the following general formula (III) and an aldehyde represented by the following general formula (IV) in an aqueous solvent in the presence of an acidic catalyst.

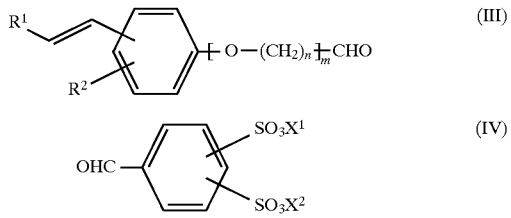

In the above general formula (III), $R^1$ is a nitrogen heterocyclic ring containing a quaternized aromatic series and it can be exemplified by the following formulas.

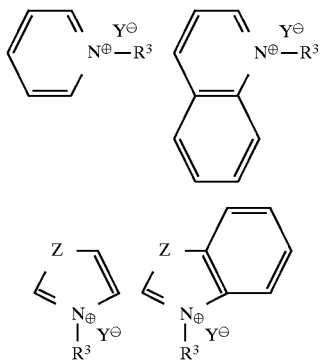

In the above formulas, $R^3$ is independently selected from a hydrogen atom, a lower alkoxyl group, a lower alkoxyl carbonyl alkyl group, or a benzyl group; Y denotes an anion ion such as a chloride ion, a bromide ion, an iodide ion, a mono-alkyl sulfonate ion, or a p-toluene sulfonate ion; and Z denotes O, S, Se, or $NR^4$ ($R^4$ is a lower alkyl group).

Acidic catalysts which can be used in the preparation of the polyvinylalcohol base polymeric compound used in the present invention include phosphoric acid, hydrochloric acid, sulfuric acid, p-toluensulfonic acid, metasulfonic acid, and a resin used for an acidic ion-exchange resin. It is noted that the acidic catalyst can be a compound represented by the general formula (IV) where $X^1$ and $X^2$ are independently selected from hydrogen, a sodium ion, a potassium ion, and an ammonium ion.

The above reaction can be conducted in an aqueous solvent, preferably in water. There is no restraint on the reaction condition. In general, however, the reaction may be performed at about 20°–100° C. for about 2–72 hours.

After terminating the reaction, the reaction mixture is poured into an abundance of poor solvent such as acetone, ethanol, or dioxane to form a precipitate of a desired resin. Then the resin is separated from the reaction mixture and then washed and dried to obtain a photosensitive resin of the present invention. After terminating the reaction, alternatively, the reaction mixture is neutralized using an alkaline aqueous solution such as an aqueous sodium hydroxide, an aqueous potassium hydroxide, or an aqueous ammonia water, or using a basic ion-exchange resin, followed by a filtration of the ion- exchange resin. Consequently, an aqueous solution of a desired photosensitive resin can be obtained.

Saponified poly (vinyl acetate)s which can be used in the above reaction include, for example, those having an average degree of polymerization of about from 200 to 5,000, preferably about from 300 to 3,000, and also ranging in a degree of saponification about from 60 to 100%, preferably about from 70 to 99%.

The reason why the average degree of polymerization should be kept in the range of 200 to 5,000 is that a sufficient sensitivity generally cannot be obtained when it is less than about 200, and a viscosity of the solution of photosensitive composition becomes too high when it is higher than about 5,000, resulting in poor applicability of the solution or lower water developmentability. In any of these instances, therefore, undesired results may be caused.

The degree of saponification should be in the range of about from 60% to 100% because sufficient water-solubility and sufficient water- developmentability generally cannot be obtained when it is less than about 60%.

Instead of saponified poly (vinyl acetate), as described above, it is possible to used a saponified copolymer of vinyl acetate with one of the other vinyl compounds including N-vinyl pyrolidone, acrylamide, and N,N- dimethyl acrylamide.

In the case of performing the reaction among this kind of saponified poly (vinyl acetate), the compound of the above general formula (III) and/or an acetal thereof, and the compound of the above general formula (IV) in the preference of an acidic catalyst, it is possible to react them together with at least one aldehyde such as formaldehyde, acetaldehyde, propionaldehyde, butylaldehyde, benzaldehyde, hydroxybenzaldehyde, and acetals thereof.

The introduction rate of the compound of the general formula (III) or the acetal thereof to the saponified poly (vinyl acetate) is generally about from 0.5 to 10 mole %, and preferably about from 0.8 to 7 mole % per mole unit. If less than about 0.5 mole % is used, the sensitivity is lowered without practicality while if it is more than about 10 mole % the water-solubility is not enough. For attaining a high sensitivity, the rate of introduction should be increased when the degree of polymerization of the saponified poly (vinyl acetate) is low, while if the degree of polymerization is high a sufficient sensitivity can be attained even though the introduction rate is low.

The introduction rate of the compound of the general formula (IV) to the saponified poly (vinyl acetate) is about from 0.1 to 20 mole %, preferably about from 0.3 to 15 mole % per mole unit. Outside of that range, the water resistibility tends to be deteriorated.

For the photosensitive resin of the present invention, it is preferable that a mole ratio represented by a constituent unit of the general formula (I)/a constituent unit of the general formula (II) is less than about 2. In this case, the resin tends to be an anionic one having the properties of good compatibility with anionic additives and avoiding a generation of scum in the step of forming a pattern of an anionic substrate, in addition to the properties of high-sensitivity and good water-resistance.

As will be described in the description concerning the third example of the synthesis thereof, inner and/or intermolecular salts may be formed in the poly (vinyl alcohol) base photosensitive resin because of no detection of phosphate ions and methyl sulfate ions under the assaying of anionic ions of the obtained resin using an ion chromatography. In Synthesis Example 3, for example, the resin has a structure represented by the following general formula (V).

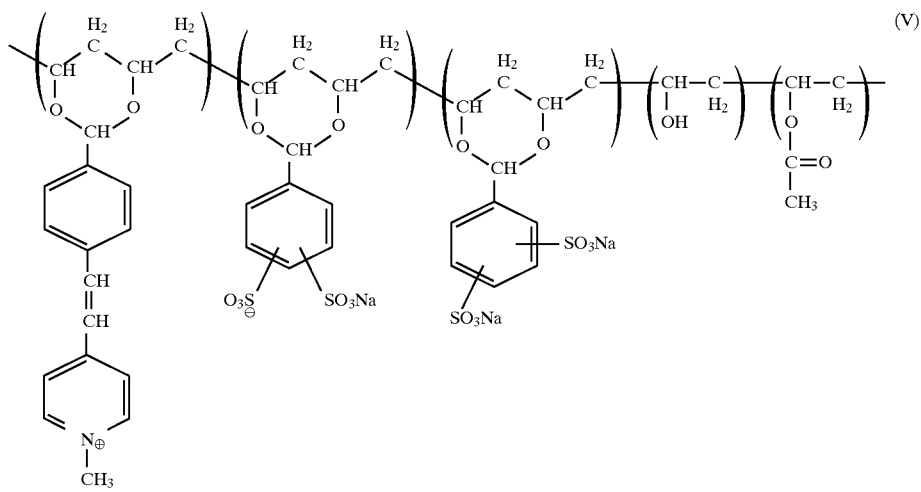

The photosensitive resin composition of the present invention comprises the above described photosensitive resin of the present invention. In particular, the resin shows good compatibility with anionic additives when the mole ratio represented by a structural unit of the general formula (I)/a structural unit of the general formula (II) is less than about 2, so that the composition may comprise an additional anionic additive.

Among anionic hydrophobic polymer emulsions, the following emulsions (1), (2), and (3) can be used as the above additional anionic additive.

(1) A hydrophobic polymer emulsion comprising an anionic surfactant as an emulsifying agent, in which the anionic surfactant may be, for example higher fatty acid salt, higher alkyl dicarboxylic acid salt, sulfated higher alcohol, alkyl sulfonic acid salt, higher alkyl disulfonic acid salt, sulfated oil or fatty acid salt, sulfonated higher fatty acid salt, higher alkyl phosphate, sulfate or sulfonate of higher fatty acid, sulfate or sulfonate of higher alcohol ether, condensate of higher fatty acid and amino acid, alkylolated sulfate of higher fatty amide, alkylated sulfonate of higher fatty amide, alkyl carboxylate of sulfonamide, ester of sulfosuccinic acid, alkyl benzenesulfonic acid salt, alkyl phenolsulfonic acid salt, alkyl naphthalene sulfonic acid salt, formaline condensate of alkyl naphthalene sulfonic acid salt, alkyl tetralin sulfonic acid salt, alkyl benzimidazole sulfonic acid salt, naphthenic acid salt, or naphthenic alcohol sulfate.

(2) A hydrophobic polymer emulsion comprising an anionic protective colloid as an emulsion, in which the anionic protective colloid may be, for example, carboxyl or sulfonate denatured polyvinyl alcohol, poly(acryl acid salt), or poly(methacryl acid salt).

(3) A hydrophobic polymer emulsion comprising an unsaturated compound as a copolymerized component, in which the unsaturated compound may be, for example, acrylic acid, metacrylic acid, itaconic acid, or 2-sulfoethyl metacrylate.

Anionic surfactants include the same chemicals as in the description concerning the anionic hydrophobic polymer emulsion.

Anionic dye stuffs include a substantive dye and an acidic dye.

Anionic pigments include a pigment having a carboxylic group or a sulfonic group, and a pigment treated with an anionic polymer or the like.

Anionic water-soluble polymers include a water-soluble polymer having a carboxyl group or a sulfonic group.

One of the advantages of the present composition is that it can be used in conjunction with the other anionic photosensitive materials such as 4,4'-diazide stilbene-2,2'-disufonic acid, 4,4'-diazide benzalacetone-2,2'-disulfonic acid, 2,5-bis (4'-azide-2'-sulfobenzylidene) cyclopentanone, 2,6-bis (4'-azide-2'-sulfobenzylidene) cyclohexane, or one of their alkali metal salts, ammonium salts, organic amine salts, and organic quaternary ammonium salts.

For incorporating the above anionic azide base photosensitive material into the composition of the present invention, it is preferable to further provide a water-soluble polymer having a good reactivity with a photoreactive intermediate of the azide group into the composition. The water-soluble polymer may be poly (vinyl pirolidone), poly(acrylamide), poly (N,N-dimethyl acrylamide), copolymer of acrylamide with diacetone acrylamide, copolymer of acrylamide with N,N-dimethylacrylamide, and cationic cellulose.

Characteristics of the present compositions can be further improved by adding at least a photopolymerizable unsaturated compound and a photopolymerization initiating system.

The photopolymerizable an unsaturated compound can be either hydrophobic or hydryophilic, for example an unsaturated prepolymer or an unsaturated polymer comprising at least one polymerizable unsaturated group having an acryl group, a methacryl group, an aryl group, a vinylether group, a vinyl group, an acrylamide group, or the like.

The photopolymerization initiating system can be a system responsible for generating free radicals having photopolymerizing activities by irradiating light, for example an α-bond cleavage type initiator such as benzoin ether, hydroxyl alkylketone, dialkoxyacetophenone, benzoyl phosphine oxide, or benzoin oxime ketone; aromatic ketone such as benzophenone, benzyl, thioxanthone, or keto-coumarin; a system of the aromatic ketone and a hydrogen donator such as amine; a system of organic peroxide, onium salt, triphenyl alkyl borate, or an iron/arene complex, and an electron donator such as thioxanthene dye, or keto-coumarin; a system of N-aryl glycine and an electron acceptor; and polyhalide compound.

In general, furthermore, it is preferable that a heat polymerization inhibitor is added in those photopolymerization systems.

The composition of the present invention may further comprise a non-ionic hydrophobic polymer emulsion, a surfactant, a dye, a pigment, an inorganic filler, an emulsion stabilizer, a plasticizer, a leveling agent, and so on, excepting any one of the above components. A cationic additive may also be used in the above composition in an acceptable amount thereof without thickening or gelating a solution of the composition. The composition may further comprise any of the phosphors for forming a phosphor pattern or any of the known light absorption materials such as graphite for forming a black matrix.

The composition of the present invention may be prepared by adding the above cationic additive and the other various additives as needed into the above polyvinyl alcohol base polymer compound and dissolving or dispersing the mixture in a water base solvent. Water is generally used as the solvent. However, it is possible to add a water-soluble solvent into the water at the concentration of less than about 50 wt. %. The water-soluble solvent can be selected from a variety of known water-soluble agents such as methyl alcohol, ethyl alcohol, isopropyl alcohol, acetone, tetrahydrofuran, dioxan, dimethyl formamide, or N-methyl pyrrolidinone, ethylene glycol monomethyl ether, ethylene glycol monoethyl ether, and the like.

The photosensitive resin composition of the present invention obtained by the way as described above can be coated and dried on a substrate so as to obtain a coating film with a dry thickness of about from 0.5 to 1, 000 $\mu$m, for example. The substrate can be selected from a metal plate made of aluminum, stainless steel, or the like, a screen mesh, a sheet of paper, a glass plate, a semiconductor substrate, and so on, with reference to the uses.

A patterning image can be formed on the coating film by the steps of irradiating the coating film with ultra-violet, for example an active beam of about from 300 to 500 nm in wavelength to cure an irradiated portion of the coating film and removing a non-irradiated portion of the coating film using water or the like. Therefore, it can be used as a screen printing plate, a black matrix or a phosphor pattern formation of a color cathode-ray tube (CRT), a color filter of CCD or LCD, a color printing proof, any one of various kinds of etching resists, or the like.

A pattern formation particularly suited for using the composition of the present invention is to form a pattern on a substrate having an anionic surface. The pattern with the remaining scum on the non-irradiated portion can be obtained when the pattern is formed on the substrate having the anionic surface using the conventional cationic polyvinyl alcohol base photosensitive resin. On the other hand, a clean pattern without any scum can be obtained when the pattern is formed on the substrate using the composition of the present invention.

The following concrete examples show pattern formation on the substrate having the anionic surface using the present composition. In these examples, a color CRT comprises strips or dot patterns of red, green, and blue phosphors and non-luminescent light-absorbing materials such as graphite that fills spaces among the phosphors, in which the latter is designated as a black matrix. It can be prepared by the following steps. First, each color phosphor pattern is formed after forming the black matrix which is provided as a graphite-dispersed liquid. A dispersant to be used in the step of dispersing the graphite is selected from anionic chemicals such as a sodium salt of carboxymethyl cellulose (Japanese Patent Application Laying-open No. 46- 218), a lithium salt of carboxymethyl cellulose (Japanese Patent Application Laying-open No. 4-82140), and sodium $\beta$- naphthalene sulfonate. Consequently, the surface of the black matrix is provided as an anionic one on which a photosensitive composition comprising dispersed phosphors is applied and then developed after light exposure. If the photosensitive composition is cationic, the development cannot be performed perfectly and scum remains on the surface. It results in the remaining phosphor on the black matrix at the non-illuminating portion. Using the anionic composition of the present invention in the photosensitive composition comprising the dispersed phosphors, on the other hand, a clean pattern of each phosphor without any color mixtures can be obtained as a result of the perfect development.

SYNTHESIS EXAMPLE 1

Polyvinyl alcohol (PVA) GH-17 (manufactured by Nippon Synthetic Chemical Industry, the degree of polymerization of 1,700 and the degree of saponification of 88%) in an amount of 10 g was dissolved in 90 g of pure water. Then 0.581 g of N-methyl-4-formylstyryl pyridinium methasulfate (hereinafter abbreviated as SbQ; the ratio to a unit mole of PVA was 0.85 mole %) and 0. 25 g of phosphoric acid were added in the dissolved solution and stirred at 30° C. for 3 hours. Furthermore, 0.783 g of sodium benzaldehyde-2, 4-disulfonate (hereinafter abbreviated as diBAS; purity= 84.7 %; concentration=1.235-fold mole of SbQ) was added and stirred at 30 ° C. for 20 hours to obtain a reaction mixture. In the reaction mixture, 2.5 g of Amberlite IR-45 (Ion-exchange resin manufactured by Rohm & Hass) was added and then stirred for 2 hours. After completion of the reaction, the pH of the mixture was checked to be neutral and then the mixture was filtered through 400-mesh screen to obtain a light-yellowish polymer aqueous solution.

Measuring with an ultraviolet spectrophotometry, introduction rates of SbQ and iBAS to polyvinyl alcohol molecules were 0.72 mole % and 0.76 mole %, respectively.

SYNTHESIS EXAMPLE 2

Polyvinyl alcohol (PVA) GH-17 (manufactured by Nippon Synthetic Chemical Industry, the degree of polymerization of 1,700 and the degree of saponification of 88%) in an amount of 10 g was dissolved in 90 g of pure water. Then 0.581 g of SbQ (the ratio to a unit mole of PVA was 0. 85 mole %) and 0.25 g of acid were added in the dissolved solution and stirred at 30° C. for 3 hours. Subsequently, 0.286 g of diBAS (concentration=0.54-molar equivalent of SbQ) was added and stirred at 30° C. for 20 hours to obtain a reaction mixture. In the reaction mixture, 2.5 g of Amberlite IR-45 (Ion-exchange resin manufactured by Rohm & Haas) was added and then stirred for 2 hours. After completion of the reaction, the pH of the mixture was checked to be neutral and then the mixture was filtered through 400-mesh screen to obtain a light-yellowish polymer aqueous solution.

Measuring with an ultraviolet spectrophotometry, the introduction rates of SbQ and iBAS to polyvinyl alcohol molecules were 0.72 mole % and 0.33 mole %, respectively.

SYNTHESIS EXAMPLE 3

Polyvninylalcohol (PVA) GH-17 (manufactured by Nippon Synthetic Chemical Industry, the degree of polymerization of 1,700 and the degree of saponification of 88%) in an amount of 10 g was dissolved in 90 g of pure water. Then 0.581 g of SbQ (the ratio to a unit mole of PVA was 0.85 mole %) and 0.25 g of phosphoric acid were added in the dissolved solution and stirred at 30° C. for 3 hours. Subsequently, 0.783 g of diBAS (concentration=1.235- molar equivalent of SbQ) was added and stirred at 30° C. for 20 hours to obtain a reaction mixture. An excess amount of acetone was poured into the reaction mixture to obtain a white polymer precipitate. The precipitate was washed with methanol sufficiently and then dried in a vacuum, resulting in 9.5 g of polyvinyl alcohol derivative.

Measuring with an ultraviolet spectrophotometry, the introduction rates of SbQ and iBAS to polyvinyl alcohol molecules were 0.72 mole % and 0.76 mole %, respectively.

In addition, methyl sulfate ions derived from SbQ and phosphate ions derived from the catalyst were detected in extremely small quantities by ion-chromatographic analysis. Consequently, the results give support to the internal salt structure represented by the general formula (V), so that it reveals that the polymer is anionic one.

SYNTHESIS COMPARATIVE EXAMPLE 1

A polyvinyl alcohol derivative comprising the above PVA (GH-17) reacted with 0.72 mole % of SbQ was obtained according to the process disclosed in Japanese Patent Laying-open No. 55-23163. There was no anionic composition in the product, so that it was a perfect cationic polymer.

Example 1

10 wt. % of the polymer aqueous solution of Synthesis Example (I) was mixed with Finetex ES-650 (manufactured by Dai Nippon Ink, Co., Ltd. ; polyester emulsion, a dry solids content of 29 wt. %) at a solids ratio of one to two. A clear photosensitive composition was obtained except for an extremely small amount of thickening.

Then the above photosensitive composition was applied on a 250-mesh screen printing plate through a screen to make a coating film of 15 μm in thickness. Subsequently, the coating film was developed with a water-spray. The coating film was exposed for 90 seconds by means of an extra-high pressure mercury-vapor lamp (2kw) positioned at a distance of 60 cm from the surface of the film. Making visual observations, there was no substantial swelling in the resulting film. In addition, a good resolution was attained.

SYNTHESIS COMPARATIVE EXAMPLE 2

10 wt. % of an aqueous solution was prepared by dissolving the polymer obtained in Comparative Example 1 as is the case with Example 1. Using the same procedure as that of Example 1, the aqueous solution was mixed with ES-200 at a solids ratio of 1 to 2, resulting in extremely high thickening. Consequently, the same test on the screen as that of Example 1 could not be performed.

Example 2

10 wt. % of the polymer aqueous solution of Synthesis Example (II) was mixed with a vinyl acetate emulsion (Mowinyl MA6 manufactured by Hoechst Synthesis, Co., Ltd.) at a solids ratio of one to two. Then the mixture was applied on a 250-mesh screen printing plate through a screen to make a coating film of 15 μm in thickness. Subsequently, the coating film was developed with a water-spray. The coating film was exposed for 110 seconds by means of an extra-high pressure mercury-vapor lamp (2kw) positioned at a distance of 60 cm from a surface of the film. According to visual observations, therefore, there was no substantial swelling in the resulting pattern. In addition, a good resolution was attained.

COMPARATIVE EXAMPLE 2

10 wt. % of the polymer aqueous solution of Synthesis Comparative Example (II) was mixed with a vinyl acetate emulsion (Mowinyl MA6 manufactured by Hoechst Synthesis, Co., Ltd.) at a solids ratio of one to two. Then the mixture was applied on a 250-mesh screen printing plate through a screen to make a coating film of 15 μm in thickness. Subsequently, the coating film was developed with a water-splay. The coating film was exposed for 110 seconds by means of an extra-high pressure mercury-vapor lamp (2 kw) positioned at a distance of 60 cm from the surface of the film. Comparing with the results of Example 2, there was observed a lager amount of swelling in the resulting pattern. In addition, a poor resolution was obtained.

Example 3

A photosensitive solution consisting of polyvinylpyrolidone and 4,4'-diazidestilbene-2,2'-sodium disulfonate, Electroduck 1530 (manufactured by Achison Japan, Co., Ltd.; a graphite fluid dispersion), and a shadow mask with a hole size of 135 μm were used according to the general process disclosed in Japanese Patent Laying-open No. 48-90815 and so on. As a result, the black matrix of the CRT with a hole size of 105 μm was prepared on a soda glass plate of 10 cm square.

Then a so-called phosphor slurry of the following formula was applied on the above glass plate and then dried to make the film with 8 to 10 μm in thickness. Subsequently, a phosphor pattern was prepared according to the following conditions. According to the observations on the resulting pattern, the packing density of the phosphor was excellent. In addition, an excellent resolution was also observed and the remaining phosphor was not detected on the black matrix.

| (Composition of Phosphor Slurry) | |
|---|---|
| Green phosphor | 10 gr. |
| 10 wt. % polymer aqueous solution of Synthesis Example 1 | 10 gr. |
| Pure water | 15 gr. |
| 5% Tamol 731 aqueous solution (manufactured by Rohm & Haas, Co., Ltd.; an anionic surfactant) | 1 gr. |
| 10% LT-221 aqueous solution (manufactured by Nippon Oil & Fats, Co., Ltd.; a nonionic surfactant) | 0.05 gr. |

(Condition of Pattern Formation)

Shadow mask: a hole diameter of 135 μm

Distance between shadow mask and glass plate: 10 mm

Distance between light-source and glass plate: 30 cm light-source: Ultra-high pressure mercury lamp, 350 nm, an intensity of illuminance of 0.15 mW/cm 2 Exposure time: 40 sec.

Development: Water-spray development

COMPARATIVE EXAMPLE 3

In an analogous fashion, furthermore, the polymer of Comparative Example 2 was evaluated. In this example, however, a phosphor slurry was prepared from the formula of Example 3 except Tamol 731 as a surfactant because there was an insufficient compatibility between them.

A phosphor pattern was prepared under the same conditions as that of Example 3 and using the above phosphor slurry. According to the observations on the resulting pattern, the packing density of the phosphor was excellent and also an excellent resolution was observed just as in the case of Example 3. In this case, however, the remaining phosphor was not detected on the black matrix. A large amount of phosphor remained on the black matrix after the development.

According to such results, the polymer of Comparative Example 1 is a cationic polymer and thus it tends to remain as a result of ionic interaction with an anionic surface of the black matrix. Consequently, it is presumed that the phosphor tends to remain on the surface of the black matrix.

According to the present invention, as described above, a photosensitive resin is provided as a polyvinyl alcohol base polymer compound obtained by suspending a styryl compound having a nitrogen heterocyclic ring with a quaternary aromatic species and a phenyl compound having two sulfone groups, so that it has the effects of the excellent properties of water-resistance and heat-resistance, and sufficient water-solubility. In addition, it also has the effect of excellent compatibility to an anionic additive by appropriately selecting the ratio of components.

The present invention has been described in detail with respect to preferred embodiments, and it will now be that changes and modifications may be made without departing from the invention in its broader aspects, and it is the intention, therefore, in the appended claims to cover all such changes and modifications as fall within the true spirit of the invention.

We claim:

1. A polyvinyl alcohol base photosensitive resin comprising a polyvinyl alcohol base polymer compound having structural units of the following general formulae (I) and (II):

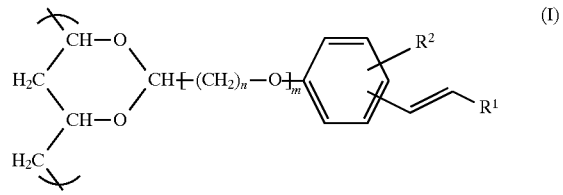

wherein $R^1$ is a residue of a heterocyclic ring having a quaternarized aromatic species, $R^2$ is a hydrogen atom or a lower alkoxyl group, m is 0 or 1, and n is an integer selected from 1 to 6; and

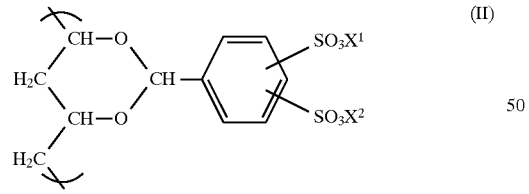

wherein each of $X^1$ and $X^2$ independently selected from a hydrogen atom, a sodium ion, a potassium ion, or an amonium ion, wherein the content of said structural unit of general formula (I) is about from 0.5 to 10 mole %, and the a content of said structural unit of general formula (II) is about from 0.1 to 20 mole %.

2. A polyvinyl alcohol base photosensitive resin of claim 1, wherein the mole ratio represented by said structural unit of general formula (I)/said structural unit of general formula (II) is less than about 2.

3. A polyvinyl alcohol base photosensitive resin composition comprising a polyvinyl base photosensitive resin of claim 1.

4. A polyvinyl alcohol base photosensitive resin composition of claim 3, wherein the mole ratio represented by said structural unit of general formula (I)/said structural unit of general formula (II) in said polyvinyl base photosensitive resin is less than about 2.

5. A polyvinyl alcohol base photosensitive resin of claim 1 further comprising anionic additive.

6. A method of forming a pattern, comprising the steps of:

forming a photosensitive resin layer on a substrate by applying a polyvinyl alcohol base photosensitive resin composition of claim 3; to a substrate performing a pattern exposure on said photosensitive resin layer; and subsequently developing the resulting exposed layer.

7. A method of forming a pattern, comprising the steps of:

forming a photosensitive resin layer on a substrate by applying a polyvinyl alcohol base photosensitive resin composition of claim 4; to a substrate performing a pattern exposure on said photosensitive resin layer; and subsequently developing the resulting exposed layer.

8. A method of forming a pattern, comprising the steps of:

forming a photosensitive resin layer on a substrate by applying a polyvinyl alcohol base photosensitive resin composition of claim 5; to a substrate performing a pattern exposure on said photosensitive resin layer; and subsequently developing the resulting exposed layer.

* * * * *